United States Patent
Kadner

(10) Patent No.: US 7,339,365 B2
(45) Date of Patent: Mar. 4, 2008

(54) PHASE DETECTOR AND METHOD OF PHASE DETECTION

(75) Inventor: Martin Kadner, Hamburg (DE)

(73) Assignee: NXP B.V., Eindhoven (NL)

( * ) Notice: Subject to any disclaimer, the term of this patent is extended or adjusted under 35 U.S.C. 154(b) by 65 days.

(21) Appl. No.: 10/561,578

(22) PCT Filed: May 14, 2004

(86) PCT No.: PCT/IB2004/050705

§ 371 (c)(1),
(2), (4) Date: Dec. 19, 2005

(87) PCT Pub. No.: WO2004/107560

PCT Pub. Date: Dec. 9, 2004

(65) Prior Publication Data

US 2006/0145682 A1    Jul. 6, 2006

(30) Foreign Application Priority Data

May 27, 2003    (EP)    ................... 03101533

(51) Int. Cl.
*G01R 25/00*    (2006.01)
*G01R 23/20*    (2006.01)

(52) U.S. Cl. .............................. 324/76.77; 324/76.78; 324/622

(58) Field of Classification Search ............. 324/76.77, 324/76.78; 702/72
See application file for complete search history.

(56) References Cited

U.S. PATENT DOCUMENTS

| | | | | |
|---|---|---|---|---|
| 3,824,494 | A * | 7/1974 | Wilcox | 331/111 |
| 4,084,133 | A * | 4/1978 | Zimmer et al. | 324/76.77 |
| 4,638,248 | A * | 1/1987 | Schweickert | 324/76.21 |
| 5,184,063 | A * | 2/1993 | Eisenhauer | 324/86 |
| 5,218,289 | A * | 6/1993 | Besson | 324/76.78 |
| 5,487,084 | A * | 1/1996 | Lindholm | 375/215 |
| 6,528,982 | B1 * | 3/2003 | Yanagisawa et al. | 324/76.77 |
| 6,822,433 | B1 * | 11/2004 | Gilbert | 324/76.77 |

\* cited by examiner

*Primary Examiner*—Anjan Deb
(74) *Attorney, Agent, or Firm*—Peter Zawilski

(57) ABSTRACT

In order to provide a phase detector and a method of phase detection which are distinguished by greater sensitivity and simple implementability, at least one differential signal of two input signals ($U_a$; $U_b$) may be formed over at least one predefined period by means of a first subtracter (12), at least one maximum value of the at least one differential signal may be detected by means of a first peak detector (16) and at least one minimum value of the at least one differential signal may be detected by means of a second peak detector (18) and at least one further differential signal ($U_{out}$) may be formed from the at least one maximum value and the at least one minimum value by means of a second subtracter (14).

10 Claims, 1 Drawing Sheet

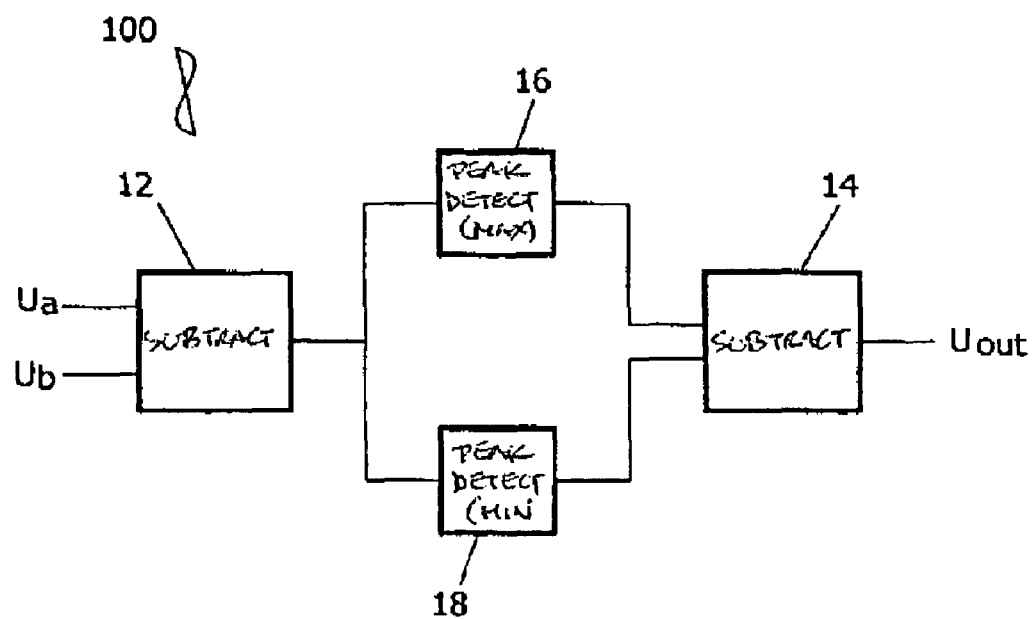
FIG.

PHASE DETECTOR AND METHOD OF PHASE DETECTION

CROSS REFERENCE TO RELATED APPLICATIONS

This application claims priority under 35 U.S.C 371 of International Patent Application Number PCT/IB04/50705, filed May 14, 2004.

The invention relates to a phase detector and a method of phase detection having the features stated in the precharacterizing clauses of claims 1 and 6.

Phase detectors generally fulfill the task of quantifying a time shift in periodic signals of the same frequency However, the sensitivity of conventional phase detectors is in need of improvement.

It is therefore an object of the invention to provide a phase detector and a method of phase detection which are distinguished by greater sensitivity and simple implementability.

This object is achieved according to the invention by a phase detector and a method of phase detection having the features stated in claims 1 and 6. The phase detector according to the invention is characterized in that at least one differential signal of two input signals may be formed over at least one predefined period by means of a fist subtracter, at least one maximum value of the at least one differential signal may be detected by means of a first peak detector and at least one minimum value of the at least one differential signal may be detected by means of a second peak detector and at least one further differential signal may be formed from the at least one maximum value and the at least one minimum value by means of a second subtracter. The value of the further differential signal is a measure of the magnitude of the phase shift of the input signals. Such a phase detector is distinguished by its greater sensitivity and particularly simple implementability.

In a preferred development of the invention, the phase detector is monolithically integrated. In this way, increased economic viability is advantageously achieved.

Furthermore, in a preferred development of the invention the phase detector is integrated into a smart card. This advantageously opens up many different areas of application of the phase detector according to the invention.

Moreover, in a preferred development of the invention at least one of the signals to be processed is an electrical, audible or visual signal or the like. In this way, particularly favorable properties are advantageously achieved, wherein this embodiment is distinguished by a particularly large number of possible applications.

In addition, in a preferred development of the invention at least one of the signals to be processed may substantially be described by a Fourier series. In this way, particularly advantageous possible uses are achieved.

The method of phase detection according to the invention is characterized in that at least one differential signal of two input signals is formed over at least one predefined period, at least one maximum value and at least one minimum value of the at least one differential signal is detected and at least one further differential signal is formed from the at least one maximum value and the at least one minimum value. The value of the further differential signal is a measure of the magnitude of the phase shift of the input signals. This method is distinguished by its greater sensitivity and particularly simple implementability.

The method according to the invention is preferably characterized in that formation of at least one difference is effected by means of a subtracter and, also preferably, detection of the at least one maximum value and/or the at least one minimum value is effected by means of a peak detector. This makes the method particularly simple to implement.

Furthermore, the method according to the invention is preferably characterized in that at least one of the signals to be processed is an electrical, audible or visual signal or the like. In this way, particularly favorable properties are advantageously achieved, wherein this method is distinguished by a particularly large number of possible applications.

Finally, the method according to the invention is preferably characterized in that at least one of the signals to be processed may substantially be described by a Fourier series. In this way, particularly advantageous possible applications are achieved.

Further preferred developments of the invention are revealed by the remaining features stated in the dependent claims.

The invention will be further described with reference to examples of embodiment shown in the drawings to which, however, the invention is not restricted.

The FIGURE shows a block diagram of one embodiment of a phase detector 100 according to the invention, which comprises a first subtracter 12, a second subtracter 14, a first peak detector 16 and a second peak detector 18. Subtracters 12 and 14 and peak detectors 16 and 18 may in turn also be assembled from a plurality of sub-components. Likewise, a combination of a plurality of components of the phase detector 100, such as in particular a monolithic integration on a microchip or in an existing microchip, is also feasible. Two input signals $U_a$ and $U_b$ of substantially the same frequency are subtracted time wise from one another by means of the first subtracter 12. The difference between the functions of the two input signals $U_a$ and $U_b$ is itself an oscillation with a minimum value and a maximum value. These are further removed from one another, the greater the phase shift of the two input signals $U_a$ and $U_b$. The maximum value of the differential signal arising is then detected by means of the first peak detector 16 and the minimum value by means of the second peak detector 18. The difference between the two extrema is then formed by means of the second subtracter 14. This further differential signal $U_{out}$ is a measure of the magnitude of the phase shift of the input signals $U_a$ and $U_b$ and forms the output signal $U_{out}$ of the phase detector 100. The function of the output signals $U_{out}$ forms a minimum value in the case of phase coincidence of the input signals $U_a$ and $U_b$. The phase detector 100 may be used in a phase shift range of from −180° to +180°, wherein no sign recognition takes place.

LIST OF REFERENCE NUMERALS

| | |
|---|---|
| 100 | Phase detector |
| 12 | First subtracter |
| 14 | Second subtracter |
| 16 | First peak detector, maximum value |
| 18 | Second peak detector, minimum value |
| $U_a$ | Input signal |
| $U_b$ | Input signal |
| $U_{out}$ | Further differential signal, output signal |

The invention claimed is:

1. A phase detector, wherein at least one differential signal of two input signals may be formed over at least one predefined period by means of a first subtracter at least one maximum value of the at least one differential signal may be detected by means of a first peak detector and at least one minimum value of the at least one differential signal may be detected by means of a second peak detector and at least one further differential signal may be formed from the at least one maximum value and the at least one minimum value by means of a second subtracter.

2. A phase detector as claimed in claim 1, characterized in that the phase detector (100) is monolithically integrated.

3. A phase detector as claimed in claim 1 characterized in that the phase detector is integrated into a smart card.

4. A phase detector as claimed in claim 1 characterized in that at least one of the signals to be processed is an electrical, audible or visual signal or the like.

5. A phase detector as claimed in claim 1 characterized in that at least one of the signals to be processed may substantially be described by a Fourier series.

6. A method of phase detection, wherein at least one differential signal of two input signals is formed over at least one predefined period, at least one maximum value and at least one minimum value of the at least one differential signal is detected and at least one further differential signal is formed from the at least one maximum value and the at least one minimum value.

7. A method as claimed in claim 6, characterized in that the formation of at least one difference is effected by means of a subtracter (14).

8. A method as claimed in claim 6 characterized in that detection of the at least one maximum value and/or of the at least one minimum value is effected by means of a peak detector.

9. A method as claimed in claim 6 characterized in that at least one of the signals to be processed is an electrical, audible or visual signal or the like.

10. A method as claimed in claim 6 characterized in that at least one of the signals to be processed may substantially be described by a Fourier series.

* * * * *